(12) United States Patent
Fogle et al.

(10) Patent No.: US 9,293,420 B2
(45) Date of Patent: Mar. 22, 2016

(54) ELECTRONIC DEVICE HAVING A MOLDING COMPOUND INCLUDING A COMPOSITE MATERIAL

(75) Inventors: Adam D. Fogle, San Jose, CA (US);
David S. Lehtonen, Austin, TX (US);
Richard Clark Blish, II, Seattle, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 336 days.

(21) Appl. No.: 12/792,129

(22) Filed: Jun. 2, 2010

(65) Prior Publication Data

US 2010/0327417 A1 Dec. 30, 2010

Related U.S. Application Data

(60) Provisional application No. 61/221,485, filed on Jun. 29, 2009.

(51) Int. Cl.
*H01L 23/28* (2006.01)
*H01L 23/552* (2006.01)
(Continued)

(52) U.S. Cl.
CPC ............ *H01L 23/552* (2013.01); *H01L 23/295* (2013.01); *H01L 23/544* (2013.01); *H01L 24/16* (2013.01); *H01L 27/11526* (2013.01); *H01L 27/11573* (2013.01); *H01L 2223/54406* (2013.01); *H01L 2223/54433* (2013.01); *H01L 2223/54486* (2013.01); *H01L 2224/12105* (2013.01); *H01L 2224/16225* (2013.01);
(Continued)

(58) Field of Classification Search
CPC ... H01L 23/295; H01L 23/552; H01L 23/544; H01L 24/16; H01L 27/11526; H01L 27/11573; H01L 2223/54406; H01L 2223/54433; H01L 2223/54486; H01L 2224/12105; H01L 2224/16225; H01L 2924/14; H01L 2924/15311
USPC .................. 257/659, 788, E23.116, E23.114
See application file for complete search history.

(56) References Cited

U.S. PATENT DOCUMENTS 4,426,549 A * 1/1984 Natwig ................. 174/110 PM
4,548,972 A * 10/1985 Williams ...................... 524/100
(Continued)

FOREIGN PATENT DOCUMENTS

CN 101277992 A 10/2008
EP 0812013 A2 12/1997
(Continued)

OTHER PUBLICATIONS

Rishard Blish, "Impact of X-Ray Inspection on Spansion Flash Memory" Published: Oct. 30, 2008.*
(Continued)

*Primary Examiner* — Asok K Sarkar
*Assistant Examiner* — Dmitriy Yemelyanov

(57) ABSTRACT

An electronic device includes a packaged integrated circuit having an integrated circuit die having an active surface, and a molding compound overlaying the active surface of the integrated circuit die. In a particular embodiment, the packaged integrated circuit includes at least approximately five weight percent (5 wt %) zinc relative to the molding compound. In another embodiment, the packaged integrated circuit includes approximately 0.3 μmol/cm² of zinc in an area parallel to the active surface of the integrated circuit die.

10 Claims, 2 Drawing Sheets

(51) Int. Cl.
*H01L 23/29* (2006.01)
*H01L 23/544* (2006.01)
*H01L 23/00* (2006.01)
*H01L 27/115* (2006.01)

(52) U.S. Cl.
CPC ... *H01L2924/01019* (2013.01); *H01L 2924/14* (2013.01); *H01L 2924/15311* (2013.01)

(56) References Cited

U.S. PATENT DOCUMENTS

| | | | |
|---|---|---|---|
| 6,097,100 A * | 8/2000 | Eguchi et al. | 257/787 |
| 6,403,882 B1 | 6/2002 | Chen et al. | |
| 6,768,198 B1 | 7/2004 | Blish, II et al. | |
| 8,470,918 B2 | 6/2013 | Hirose et al. | |
| 2003/0024723 A1 * | 2/2003 | Igarashi et al. | 174/52.1 |
| 2003/0052420 A1 * | 3/2003 | Suzuki et al. | 257/787 |
| 2005/0013082 A1 | 1/2005 | Kawamoto et al. | |
| 2005/0184405 A1 * | 8/2005 | Bai et al. | 257/787 |
| 2006/0148317 A1 * | 7/2006 | Akaike et al. | 439/607 |
| 2007/0230131 A1 | 10/2007 | Bunyan | |
| 2009/0198007 A1 * | 8/2009 | Wang | 524/423 |
| 2009/0215943 A1 | 8/2009 | Hirose et al. | |

FOREIGN PATENT DOCUMENTS

| | | | |
|---|---|---|---|
| EP | 1266936 A1 | 12/2002 | |
| EP | 2036860 A1 | 3/2009 | |
| JP | 172054 A | 7/2008 | |
| JP | 2008172054 A | 7/2008 | |
| KR | 10-2008-0049087 A | 6/2008 | |
| WO | 0243456 A2 | 5/2002 | |
| WO | 2006036548 A2 | 4/2006 | |

OTHER PUBLICATIONS

Partial International Search Report mailed Sep. 13, 2010 for PCT/US2010/039585, 3 pages.

Blish, II, Richard C. et al., "Filter Optimization for X-ray Inspection of Surface-Mounted ICs," IEEE 40th Annual International Reliability Physics Symposium, Dallas, TX, Apr. 11, 2002, pp. 377-379.

Blish, II, Richard C. et al., "Filter Optimization for X-ray Inspection of Surface-Mounted ICs," IEEE Transactions of Device and Materials Reliability, vol. 2, No. 4, Dec. 2002, pp. 102-106.

Blish, Richard, "Dose Minimization During X-ray Inspection of Surface-Mounted Flash ICs," Application Note, Spansion, Publication No. Dose_Minimization_AN, rev. 1, Oct. 10, 2008, 4 pages.

Written Opinion of the International Searching Authority for International Application No. PCT/US2010/039585 dated Nov. 22, 2010; 11 pages.

SIPO Office Action for Chinese Application No. 201080029411.3 dated Jan. 26, 2014; 2 pages.

SIPO Office Action for Chinese Application No. 201080029411.3 dated Apr. 7, 2015; 2 pages.

SIPO Office Action for Chinese Application No. 201080029411.3 dated Sep. 25, 2014; 4 pages.

* cited by examiner

ELECTRONIC DEVICE HAVING A MOLDING COMPOUND INCLUDING A COMPOSITE MATERIAL

CROSS-REFERENCE TO RELATED APPLICATIONS

This application claims the benefit of U.S. Provisional Application No. 61/221,485, filed Jun. 29, 2009, which is incorporated by reference herein its entirety.

FIELD OF THE DISCLOSURE

The present disclosure generally relates to electronic devices and molding compounds for electronic devices.

BACKGROUND

Semiconductor chips and other integrated circuit dies are typically packaged in a molding compound to produce a packaged integrated circuit. The packaged integrated circuit can be coupled to a printed circuit board and linked to other components of a system. Manufacturers often test printed circuit boards to ensure that packaged integrated circuits and other components have been placed on the board properly.

BRIEF DESCRIPTION OF THE DRAWINGS

It will be appreciated that for simplicity and clarity of illustration, elements illustrated in the Figures have not necessarily been drawn to scale. For example, the dimensions, angles and curvatures of some of the elements may be exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF THE DRAWINGS

Figure 1:
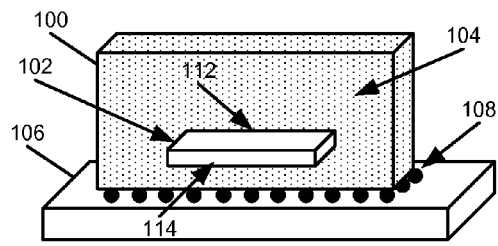
FIGS. 1-4 are diagrams illustrating a particular embodiment of an electronic device including a molding compound.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In addition, the materials, methods, and examples are illustrative only and not intended to be limiting.

Flash memory and other packaged integrated circuit devices can be coupled to printed circuit boards for use in computing systems and other systems. Manufacturers may use imaging technologies to evaluate positioning, alignment, continuity, solder connection quality and other attributes of an integrated circuit device or other electronic device after it is coupled to the printed circuit board. In some cases, these imaging devices can emit more radiation than conventional devices. For example, a manufacturer or other party may use an x-ray imaging device adapted to emit a dose of greater than approximately 10 Rads, such as from approximately 10 Rads to approximately 500 Rads at a 160 KeV peak. The high dose of radiation emitted by the imaging device can cause externally generated failures in an electronic device coupled to the printed circuit board.

For instance, an integrated circuit that includes a charge storage technology, such as a mirror bit or other charge trap cell, can be susceptible to externally generated failures that include a loss of stored charge. A charge loss event can occur when a photon or photon stream included in x-ray radiation or other radiation displaces an electron from a charge storage cell at the integrated circuit, thereby driving charge out of the cell. The charge loss event can produce an undesirable shift in threshold voltages ($V_t$) for programmed bits in the cell, resulting in degraded data readability and a potential for system failure.

FIG. 1 illustrates a particular embodiment of an electronic device. The electronic device can be a packaged integrated circuit 100 that includes an integrated circuit die 102 or other microchip. The packaged integrated circuit 100 also includes a molding compound 104 overlaying an active portion 112 at a major surface of the integrated circuit die 102. In one embodiment, the molding compound 104 can substantially surround or encapsulate the integrated circuit die 102.

In a particular embodiment, the packaged integrated circuit 100 can be coupled to a printed circuit board 106 via a plurality of mounts 108, such as a ball grid array or pin grid array. In a particular embodiment, the integrated circuit die 102 can include a charge storage structure (not shown) such as a mirror bit cell or other charge trap based memory.

In another embodiment, the integrated circuit die 102 can include a floating gate structure. In an illustrative embodiment, the packaged integrated circuit 100 can include a flash memory device.

In an illustrative embodiment, the molding compound 104 can be a composite material that includes a silicon compound, such as silicon dioxide. In a particular embodiment, the molding compound 104 can also include an organic material, such as epoxy or another organic material. The molding compound 104 can also include a phenolic hardener, a catalyst, a pigment, a mold release agent, a flame retardant, another component, or any combination thereof.

In a particular embodiment, the composite material can have an x-ray mass absorption coefficient of approximately 2000 cm$^2$/g to approximately 5000 cm$^2$/g, at an x-ray energy of from approximately 1 KeV to approximately 3 KeV, such as approximately 2000 cm$^2$/g to approximately 5000 cm$^2$/g, at an x-ray energy of from approximately 1 KeV to approximately 3 KeV. For instance, the composite material has an x-ray mass absorption coefficient of approximately 3000 cm$^2$/g at an x-ray energy of approximately 2 KeV.

In an example, the packaged integrated circuit 100 can include a zinc material, an aluminum material, another material, or any combination thereof, which is adapted to absorb soft x-rays while allowing harder x-rays used or imaging to pass through. For example, the material can be adapted to transmit x-ray radiation having a wavelength of less than approximately 1 nm. Soft x-rays can include, for instance, x-rays having a wavelength of approximately 1 nm to approximately 10 nm, having an energy of less than or equal to approximately 10 keV to approximately 1 keV. In one example, an integrated circuit die that includes silicon can be vulnerable to x-ray radiation having an energy of approximately 2 KeV, 5 keV, or 9 keV (2 Key is the K-edge for silicon). In an illustrative embodiment, the material can be adapted to absorb soft x-rays characterized by an absorbed dose of greater than or equal to approximately 10 Rads.

For instance, the molding compound 104 can include zinc oxide, zinc borate, another zinc material or any combination thereof. In a particular embodiment, the molding compound 104 can include zinc in an amount greater than or equal to two percent by weight (2 wt %) relative to the molding compound 104, such as at least approximately five weight percent (5 wt %) zinc. In one example, the molding compound 104 can include from approximately five weight percent (5 wt %) to approximately twenty-five (25 wt %) zinc, such as from approximately five weight percent (5 wt %) to approximately ten weight percent (10 wt %) zinc, from approximately ten weight percent (10 wt %) to approximately fifteen weight percent (15 wt %) zinc, from approximately fifteen weight percent (15 wt %) to approximately twenty weight percent (20 wt %) zinc, or from approximately twenty weight percent (20 wt %) to approximately twenty-five weight percent (25 wt %) zinc.

In an illustrative embodiment, the molding compound 104 can include approximately ten weight percent (10 wt %) zinc. For example, the molding compound can include approximately eighty weight percent (80 wt %) of silica, ten weight percent (10 wt %) organic material and approximately ten weight percent (10 wt %) of a zinc material.

Figure 2:
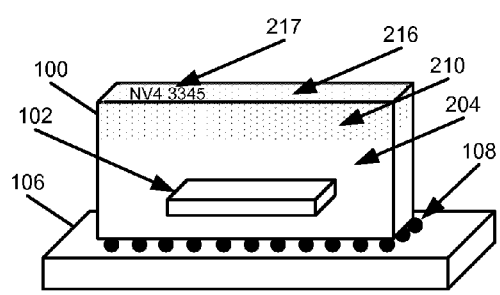

As illustrated in FIG. 1, the molding compound 104 can include a substantially uniform distribution of the material adapted to absorb soft x-rays. Alternatively, the material can be substantially distributed such that the active surface 112 of the integrated circuit die 102 is between the zinc (or other material) and another surface of the integrated circuit die 102 that is opposite the active surface 112. For example, as illustrated in FIG. 2, a molding compound 204 can include a layer of zinc 210 distributed in an area that is adjacent to a surface of the packaged integrated circuit 100, such as a top surface 216 that may include a mold-marking 217 or similar identifier. X-ray radiation can be emitted from a source facing the top surface 216, and the zinc or other compound can be substantially distributed in an area between the source and the integrated circuit die 102.

Figure 3:
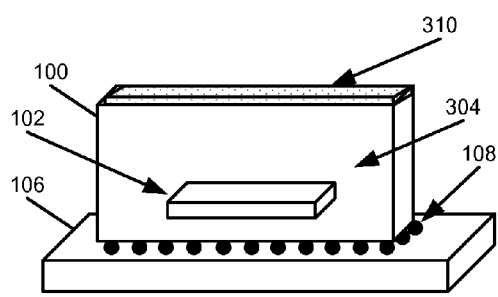
Figure 4:
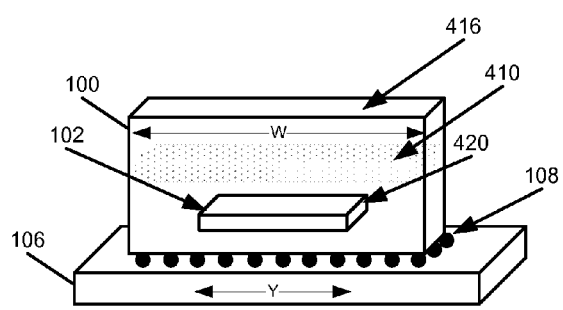

In another embodiment, as illustrated in FIG. 3, the packaged integrated circuit 100 can include zinc or another material in a coating 310 between the integrated circuit die 102 and an x-ray source. In still another embodiment, the packaged integrated circuit 100 can include zinc or another material in a layer 410 below the top surface 416 of the packaged integrated circuit 100 but above the active surface of the integrated circuit die. The zinc or other material can be distributed in an area having a width, such as the width W, which is greater than a width Y of the integrated circuit die 102, such that soft x-rays moving toward the integrated circuit die 102 at an angle will be absorbed.

In one embodiment, the compound adapted to absorb soft x-rays can be present in a concentration relative to the molding compound 104, which is inversely proportional to a thickness of the integrated circuit die 102. For instance, as a thickness 420 of the integrated circuit die 102 increases, yet a total size of the packaged integrated circuit 100 stays substantially the same, a concentration of the zinc or other material can decrease, so long as from approximately 0.2 μmol/cm$^2$ to approximately 0.5 μmol/cm$^2$, such as approximately 0.3 μmol/cm$^2$, of zinc or other material is parallel to the active surface of the integrated circuit die and between the active surface and an x-ray or other radiation source. In other embodiments, an amount of zinc that is less than approximately 0.2 μmol/cm$^2$ or greater than approximately 0.5 μmol/cm$^2$ can be used. The zinc or other material can be present in a concentration such that the molding compound remains transparent, translucent or opaque, as desired.

The above embodiments have been described for instances where a radiation source is closer to the active surface of an integrated circuit die than to another surface. Those skilled in the art will appreciate that the embodiments described above may be altered to account for instances when radiation is emitted from a source to a non-active surface of the integrated circuit die 102, such as the surface 114, which is a major surface of the die 102. For instance, where x-ray radiation is emitted from beneath a stacked chip device (i.e., closer to a non-active surface of an integrated circuit die), a lower chip that is closer to the radiation source can be impacted more by radiation than an upper chip further from the radiation source. Thus, zinc or another suitable material having x-ray mass absorption properties described herein, can be distributed between the radiation source and the non-active surface of the integrated circuit die, such that soft x-rays are absorbed. For example, approximately 0.3 μmol/cm$^2$ of zinc, or such other suitable material, can be present between the other surface of the integrated circuit die 102 and an x-ray or other radiation source.

In an illustrative, non-limiting embodiment, the printed circuit board can include a zinc material, such as zinc oxide, zinc borate, another zinc material, an aluminum material, another material adapted to absorb soft x-rays while allowing x-rays at wavelengths used for imaging to pass through, or any combination thereof.

Figure 5:
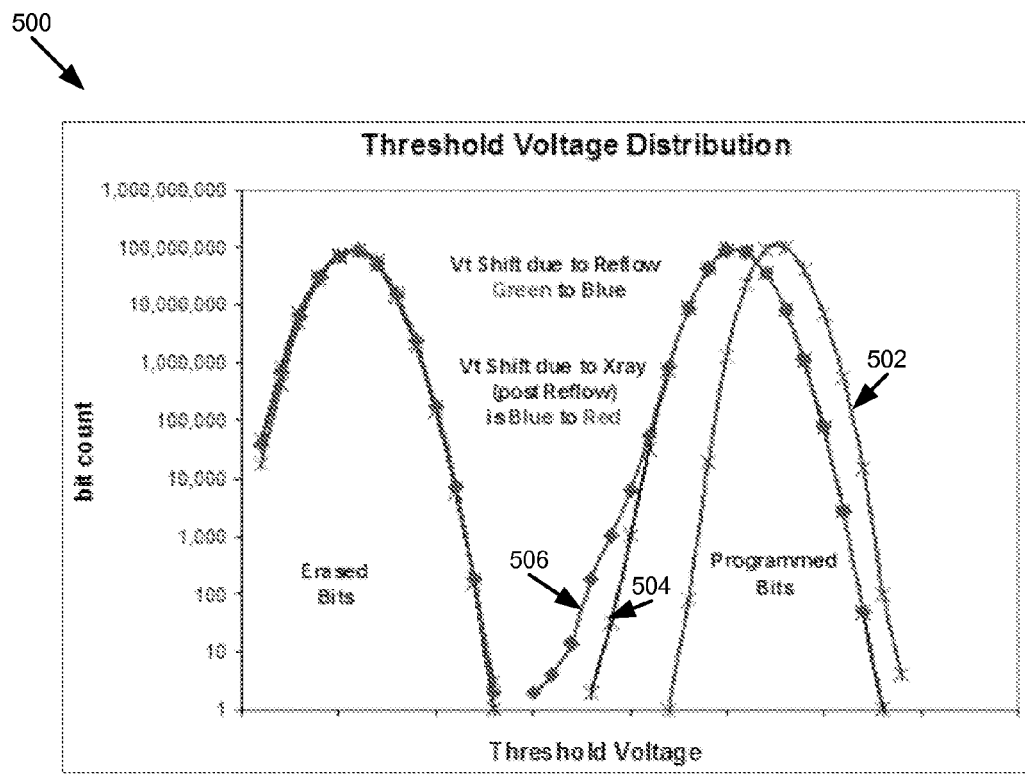
FIG. 5 is a plot illustrating threshold voltage distributions for memory cells of an electronic device before and after the electronic device is exposed to radiation.

FIG. 5 is a plot illustrating threshold voltage distributions for memory cells of an electronic device, such as a packaged integrated circuit, before and after the electronic device is exposed to radiation. In one example, the memory cells can include memory cells that are logically designated as zeros (programmed bits) or as ones (erased bits) in the integrated circuit. The plot 500 includes an initial $V_t$ distribution 502 for a plurality of memory cells before the electronic device is exposed to radiation. The plot 500 also includes a reflow $V_t$ distribution 504 for the plurality of memory cells after thermal treatment. The plot 500 includes a $V_t$ distribution 506 for the plurality of memory cells after the electronic device is exposed to x-ray radiation characterized by an absorbed dose of approximately 400 Rads at 50 KeV.

It is found that, in a particular embodiment, a $V_t$ distribution (not shown) for a plurality of memory cells of an electronic device that includes a zinc material as described herein can be substantially coincident with the reflow $V_t$ distribution 504. For example, in the electronic device including zinc, no more than 1000 ppm of the memory cells are perturbed after exposure to the x-ray radiation. For example, no more than 700 ppm, such as no more than 600 ppm or no more than 450 ppm can be perturbed. In one embodiment, a change in threshold voltage for a memory cell after exposure of the electronic device to radiation can be smaller than a read margin (such as a guard-banded threshold voltage to permit distinguishing programmed bits from erased bits), when the electronic device includes a zinc material as described herein.

Conversely, in the electronic device not including zinc, thousands of the memory cells are perturbed after exposure to the x-ray radiation, such that they could produce Read errors. Further, the $V_t$ distribution 504 can include flyer bits, whereas the $V_t$ distribution 502 can include no flyer bits. Moreover, the memory cells in the electronic device not including zinc can exhibit a finite read error rate after exposure to the x-ray radiation.

Many different aspects and embodiments are possible. Some of those aspects and embodiments are described below. After reading this specification, skilled artisans will appreciate that those aspects and embodiments are only illustrative and do not limit the scope of the present invention.

For example, according to a first aspect, an electronic device comprises a packaged integrated circuit that includes: an integrated circuit die having major surface; and a molding compound overlaying the major surface of the integrated circuit die, wherein the packaged integrated circuit includes at least approximately five weight percent (5 wt %) zinc relative to the molding compound.

According to a specific embodiment of the first aspect the molding compound includes the at least approximately five weight percent (5 wt %) zinc. According to a further embodiment, the integrated circuit die includes another surface opposite the major surface and wherein the major surface is disposed between the other surface and substantially all of the zinc in the molding compound.

According to various specific embodiments of the first aspect can include a molding compound including: approximately 10 wt % zinc; approximately 5 wt % to approximately 25 wt %; 5 wt % to approximately 10 wt % zinc; 10 wt % to approximately 15 wt % zinc; approximately 15 wt % to approximately 20 wt % zinc; approximately 20 wt % to approximately 25 wt % zinc. According to another specific embodiment of the first aspect the zinc is substantially uniformly distributed throughout the molding compound. According to another specific embodiment of the first aspect the zinc is disposed in a layer of the molding compound that includes a surface of the packaged integrated circuit. According to additional embodiments, the zinc is included in a coating on a surface of the molding compound.

According to another specific embodiment of the first aspect the zinc is disposed in a layer of the molding compound that does not include a surface the molding compound.

According to another specific embodiment of the first aspect the molding compound includes zinc oxide, zinc borate or a combination thereof.

According to another specific embodiment of the first aspect the molding compound comprises a composite material that includes silica, an organic material, an epoxy resin, a phenolic hardener, a catalyst, a pigment, a mold release agent, a flame retardant, or a combination thereof.

According to another specific embodiment of the first aspect the molding compound includes a mold marking.

According to a second aspect, an electronic device comprises a packaged integrated circuit that includes: an integrated circuit die having an major surface; and a material overlaying a major surface of the integrated circuit, the material having an x-ray mass absorption coefficient of approximately 1000 to 10,000 $cm^2/g$.

According to a specific embodiment, the second aspect further comprises a molding compound that includes the material overlaying the major surface, wherein the material includes approximately 0.3 $\mu mol/cm^2$ of zinc in an area parallel to the major surface of the integrated circuit die. According to a further embodiment, the zinc is distributed between a radiation source and the major surface of the integrated circuit die. The zinc can also be distributed between a radiation source and a surface other than the major surface of the integrated circuit die.

According to a third aspect, an electronic device comprises: a packaged integrated circuit that includes: an integrated circuit die having an major surface; and a molding compound overlaying the major surface of the integrated circuit die, wherein the molding compound includes a composite material adapted to absorb soft x-ray radiation characterized by an absorbed dose of greater than or equal to approximately 10 Rads. According to an embodiment of the third aspect, the soft x-ray radiation includes radiation having a wavelength of from approximately 1 nm to approximately 10 nm.

According to another embodiment of the third aspect, the soft x-ray radiation includes x-ray radiation having an energy of less than or equal to approximately 10 keV, 9 keV, approximately 5 keV, or approximately 2 keV.

According to another embodiment of the third aspect, the molding compound is adapted to absorb soft x-ray radiation characterized by an absorbed dose of from approximately 10 Rads to approximately 500 Rads.

According to another embodiment of the third aspect, the molding compound is adapted to transmit x-ray radiation having a wavelength of less than approximately 1 nm.

According to another embodiment of the third aspect, the molding compound includes zinc oxide, zinc borate or a combination thereof.

According to another embodiment of the third aspect, the molding compound includes approximately 10 wt % zinc, or approximately 5 wt % to approximately 25 wt %.

According to a fourth aspect, an electronic device comprises a packaged integrated circuit that includes: an integrated circuit die having an major surface and a plurality of memory cells; a molding compound overlaying the major surface of the integrated circuit die; and wherein, after the electronic device is exposed to x-ray radiation characterized by an absorbed dose of approximately 200 Rads at 50 KeV, the integrated circuit includes no more than approximately 1000 ppm of memory cells whose $V_t$ has been changed by an amount greater than or equal to a Read margin for the electronic device.

According to an embodiment of the fourth aspect, the plurality of memory cells in the integrated circuit exhibits a number of perturbed bits less than or equal to approximately 700 ppm after the electronic device is exposed to x-ray radiation characterized by an absorbed dose of approximately 200

Rads at 50 KeV. According to a further embodiment, the plurality of memory cells in the integrated circuit exhibits a number of perturbed bits less than or equal to approximately 450 ppm after the electronic device is exposed to x-ray radiation characterized by an absorbed dose of approximately 200 Rads at 50 KV.

According to another embodiment of the fourth aspect the memory cells comprise programmed bits.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device, comprising:
   an integrated circuit die having a top surface; and
   a molding compound encapsulating the integrated circuit die, the molding compound comprising approximately 20 wt % to approximately 25 wt % zinc and a concentration of zinc of approximately 0.2 $\mu mol/cm^2$ to approximately 0.5 $\mu mol/cm^2$, wherein the zinc is provided in the form of zinc borate.

2. The electronic device of claim 1, wherein the molding compound comprises a composite material that includes silica, an organic material, an epoxy resin, a phenolic hardener, a catalyst, a pigment, a mold release agent, a flame retardant, or a combination thereof.

3. The electronic device of claim 1, wherein the molding compound includes a mold marking.

4. An electronic device, comprising:
   an integrated circuit die having a top surface; and
   a molding compound encapsulating the integrated circuit die, the molding compound having an x-ray mass absorption coefficient of approximately 1000 to 10,000 $cm^2/g$ and comprising zinc borate and approximately 20 wt % to approximately 25 wt % of zinc based on the zinc borate.

5. The electronic device of claim 4, wherein the molding compound is configured to absorb soft x-ray radiation which includes radiation having a wavelength of from approximately 1 nm to approximately 10 nm.

6. The electronic device of claim 4, wherein the molding compound is configured to absorb soft x-ray radiation having an energy of less than or equal to approximately 10 keV.

7. The electronic device of claim 4, wherein the molding compound is configured to absorb soft x-ray radiation having an energy of less than or equal to approximately 2 keV.

8. The electronic device of claim 4, wherein the molding compound is configured to absorb soft x-ray radiation of an absorbed dose of from approximately 10 Rads to approximately 500 Rads.

9. The electronic device of claim 4, wherein the molding compound is configured to transmit x-ray radiation having a wavelength of less than approximately 1 nm.

10. The electronic device of claim 4, wherein the molding compound further comprises a composite material that includes silica, an organic material, an epoxy resin, a phenolic hardener, a catalyst, a pigment, a mold release agent, a flame retardant, or a combination thereof.

* * * * *